United States Patent [19]
Bohrn et al.

[11] Patent Number: 4,877,484
[45] Date of Patent: * Oct. 31, 1989

[54] FLOCCED 2:1 LAYERED SILICATES AND WATER-RESISTANT ARTICLES MADE THEREFROM

[75] Inventors: Walter J. Bohrn, Lancaster; Richard A. Brubaker, Willow Street; Shelly N. Garman, Lancaster; Lewis K. Hosfeld, Mountville; Kenneth K. Ko; Thomas M. Tymon, both of Lancaster, all of Pa.

[73] Assignee: Armstrong World Industries, Inc., Lancaster, Pa.

[*] Notice: The portion of the term of this patent subsequent to Nov. 17, 2004 has been disclaimed.

[21] Appl. No.: 15,756

[22] Filed: Feb. 17, 1987

Related U.S. Application Data

[63] Continuation-in-part of Ser. No. 715,973, Mar. 25, 1985, abandoned.

[51] Int. Cl.$^4$ .................... C04B 20/02; C04B 20/06
[52] U.S. Cl. .................................... 162/103; 162/108; 162/146; 162/181.6; 428/325; 65/17; 65/900; 501/2

[58] Field of Search ................ 65/2, 17, 30.13, 30.14, 65/33, 900; 501/2, 3; 162/181.2, 181.4, 181.6, 103, 108, 146; 428/145, 149, 325, 404, 406

[56] References Cited

U.S. PATENT DOCUMENTS

| | | | |
|---|---|---|---|
| 4,219,609 | 8/1980 | Cundy | 428/446 |
| 4,450,095 | 5/1984 | Finlayson | 252/315.2 |
| 4,455,382 | 6/1984 | Wu | 501/2 |
| 4,480,060 | 10/1984 | Hoda et al. | 523/466 |
| 4,539,046 | 9/1985 | McAloon et al. | 106/121 |
| 4,608,303 | 8/1986 | Ballard et al. | 428/357 |

Primary Examiner—Kenneth M. Schor
Assistant Examiner—L. Johnson

[57] ABSTRACT

Disclosed are flocced mineral materials which may be utilized to prepare high temperature resistant, water resistant articles. These materials are prepared by utilizing, as a starting material, a gellable layered swelled silicate that has an average charge per structural unit that ranges from about −0.4 to −1 and which contains interstitial cations which promote swelling with a source of at least one species of multi-amine derived cations.

31 Claims, No Drawings ns, environmental protective coatings,
and washable and environmentally stable building materials.

FLOCCED 2:1 LAYERED SILICATES AND WATER-RESISTANT ARTICLES MADE THEREFROM

This is a continuation-in-part application of U.S. patent application No. 715,973 now abandoned.

BACKGROUND OF THE INVENTION

It is known that non-asbestos papers and/or sheets may be produced from water-swellable inorganic materials and, in particular, swelled silicate gels. For example, U.S. Pat. No. 4,239,519 is directed to the preparation of synthetically derived, inorganic, crystal-containing gellable, water-swelling sheet silicates and certain articles, such as papers, fibers, films, boards, and laminates, produced therefrom. These non-asbestos papers and/or sheets exhibit good high temperature stability and good chemical resistance. Furthermore, since asbestos fibers are not utilized in their manufacture, such articles will not have the health hazards which are associated with asbestos containing articles.

U.S. Pat. No. 4,239,519 teaches the method for making the precursor gellable silicates used to produce said papers or sheet articles, as involving three fundamental steps: (a) a fully or predominantly crystalline body is formed which contains crystals consisting essentially of a lithium and/or sodium water-swelling mica selected from the group of fluorhectorite, hydroxyl hectorite, boron fluorphlogopite, hydroxyl boron phlogopite, and solid solutions between those and other structurally compatible species selected from the group of talc, fluortalc, polylithionite, fluorpolylithionite, phlogopite, and fluorphlogopite; (b) that body is contacted with a polar liquid, normally water, to cause swelling and disintegration of the body accompanied with the formation of a gel; and (c) the solid: liquid ratio of the gel is adjusted to a desired value depending upon the application therefore. Glass-ceramics are the preferred crystalline starting bodies. Those products are then contacted with a source of large cations, i.e., with an ionic radius larger than that of the lithium cation, to cause macro flocculation of the gel and an ion exchange reaction to take place between the large cations and the $Li^+$ and/or $Na^+$ ions from the interlayer of the crystals.

Alternatively, U.S. Pat. Nos. 3,325,340 and 3,454,917 teach producing aqueous dispersions of vermiculite flaked crystals which have been caused to swell due to the introduction therein of interstitial ions such as: (1) alkylammonium cations having between 3 and 6 carbon atoms inclusive in each carbon group such as methylbutylammonium, n-butylammonium, propylammonium and iso-amylammonium; (2) the cationic form of aminoacids, such as lysine and ornithine; and/or (3) lithium.

While the articles, such as papers, sheets and films, prepared via the prior art processes set forth above exhibit excellent heat resistance and are useful in a wide variety of applications, it has been discovered that such articles generally do not exhibit good sealing characteristics, thus curtailing their use as gasket materials. The prior art articles also exhibit a certain amount of water sensitivity which is generally exhibited by the articles having a considerable loss of strength and general deterioration of mechanical and electrical properties when exposed to high humidity environments or submerged in water or other polar liquids. This sensitivity to water correspondingly limits the utility of these articles in certain applications, such as, for example, head gaskets, electrical insulators, environmental protective coatings, and washable and environmentally stable building materials.

SUMMARY OF THE INVENTION

Several embodiments are described herein.

One embodiment describes a method by which an aqueous dispersion of 2:1 layered silicate mineral material is flocculated using specifically described cations. Surprisingly, it has been discovered that certain cations derived from diamines, triamines, and tetraamines will flocculate 2:1 layered silicate instead of maintaining, allowing, or causing the silicate to disperse. Advantageously, in the instant process, cations derived from diamines, triamines, and tetramines can be used to conduct an ion exchange reaction with an aqueous dispersion of 2:1 layered silicate material having an average charge per structural unit of from about $-0.4$ to about $-1.0$. This ion exchange reaction will produce a flocculated silicate. The flocculated 2:1 layered silicate material has a semi-solid, soft consistency even in large amounts of water. It should be emphasized that it is the amine functionality which has the ability to flocculate these silicates. The inclusion of other moieties which are acidic such as lysine and ornithine will interfer with flocculation. Such groups should therefore be avoided.

A method of preparing a flocced mineral material that can be utilized to form a non-asbestos high temperature article that exhibits water resistance which method comprises (1) contacting a swelled 2:1 layered silicate having an average charge per structural unit that ranges from about $-0.4$ to about $-1$ and which contains exchangeable interstitial ions with at least one species of an exchange cation derived from compounds consisting essentially of diammonium compounds; thereby, (2) conducting an ion exchange reaction between at least some of the exchangeable interstitial ions, and at least some of the exchange cations; further providing, however, that the 2:1 layered silicate was swelled by contacting the 2:1 layered silicate with a polar liquid for a sufficient time to cause swelling of the layers and gel formation.

It is important to realize that the flocced silicate product of the instant process is very distinct from the silicate dispersion even when compared to the high solids content dispersions which are semi-solid gels. The flocculated layered silicate material produced by the instant process will not readily redisperse in water as will the layered silicate gels containing other interstitial cations such as ornithine or n-butylammonium, n-propylammonium, and lithium.

Since the silicate floc of the instant invention remains agglomerated, not readily re-dispersing, the product of the instant ion-exchange reaction can be washed, preferably with water. This is a significant feature since similar interstitial cation exchanged-silicate combinations give silicate products that do not retain its agglomerated state, and instead, wash away or is redispersed in water.

A significant feature of the instant silicate-interstitial cation combination, therefore, is its superior water resistance. In addition to this, the floc produced by the instant method is more easily collected and handled than the prior art counterparts.

High temperature, fire-resistant, non-asbestos, water-resistant articles, such as sheet, paper, board, film, fiber and laminated articles, can be made using the instant silicate material that is prepared by utilizing an exchange cation that is derived from diamines compounds. Such articles, surprisingly, have been found to exhibit, in general, superior mechanical properties as can be noted in the tensile strength and puncture resistant data given in the experimental section.

The diamines are therefore superior silicate flocculants, enabling one to obtain stronger and more water-resistant flocs than other flocculants. Even more remarkably, it has been discovered that certain groups of diamines can be used to optimize electrical properties, and others to optimize mechanical flexibility (see elongation tests).

With reference to heat resistance, the articles that are produced according to the present invention are completely stable to temperatures of approximately 350°–400° C. and maintain their structural stability to approximately 800° C.

Other embodiments include (1) the flocced 2:1 layered silicate gel material, having an average charge per structural unit of from about −0.4 to about −1.0 having an ion exchanged interstitial cations dervied from compounds consisting of: diammonium compounds; (2) the flocculated silicate of (1) including an organic oligomer (added before or after flocculation); preferably epoxy; (3) a process for the flocced diammonium exchanged-silicate and epoxy composition of (2); and (4) the compositions of both (1) and (2) including fibrous or fibrous pulp materials; preferably, polybenzimidazole. The epoxy flocculated silicate materials can also be prepared with guanidinium-derived cations which are also described herein.

The above indicated compounds can also be referred to as "multiamines".

Still other embodiments include articles and films made from the above described flocced mineral gel.

DETAILED DESCRIPTION OF THE INVENTION

The articles and the flocced mineral dispersions of the present invention are, in one embodiment of the invention, prepared by utilizing, as a starting material, a dispersable sheet (2:1 layered) silicate that has an average charge per structural unit of from about −0.4 to about −1 and which contains interstitial exchangeable cations that promote swelling. The specific exchange cations in the starting material will depend on the silicate being utilized. For example, if a synthetically derived gellable silicate, which is made, for example, according to the procedures of U.S. Pat. No. 4,239,519, is utilized as a starting material, the exchange cations will generally be $Li^+$ and/or $Na^+$ ions. If a natural vermiculite dispersion, such as made according to U.S. Pat. No. 3,325,340, is utilized, the exchange cations will generally include alkyl-ammonium cations or other cations mentioned in the reference. The silicate, whether synthetic or natural in origin, will most often have morphologies that are represented by thin flakes which are generally disc, strip, and/or ribbons. Although there is no intention or practical need to be limited to any specific measurements for the flakes, they will typically have measurements which are from about 500 A to 100,000 A, and preferably 5,000 A to 100,000 A in length, 500 A to 100,000 A in width, and less than 100 A thick.

The silicates which can be used to prepare the instant composition and articles includes both micas and vermiculites. The silicates which can be used in the process of the present invention can all be referred to as 2:1 layered silicates and can be found defined and described in: *Crystal Structures of Clay Materials and Their X-Ray Identification* by G. W. Brindley and G. Brown, published by Mineralogical Society, 1980, especially pages 2–10. The term "mica" is used herein to refer to layered silicates having a charge density approximately equal to −1, while vermiculites have a charge density approximately in the range of −0.6 to −0.9. Examples of specific layered silicates which may be used in the invention are vermiculite, muscovite, phlogopite, biotite, fluorphlogopite, lepidolite and lepidomelane. A preferred mica can be selected from the group of fluorhectorite, hydroxyl hectorite, boron fluorphlogopite, hydroxyl boron phlogopite, and solid solutions among those and between those and other structurally compatible species selected from the group of talc, fluortalc, polylithionite, fluorpolylithionite, phlogopite and fluorphlogopite.

The term "vermiculite" is used herein to refer to the group of rock-forming mineral species characterized by a layer lattice structure in which the silicate layer units have a thickness of approximately 10A (1.0 nm), the main elements present in the layers being magnesium, iron, aluminum, silicon and oxygen, the layers being separated by one or two sheets of water molecules associated with cations such, for example, as magnesium, calcium, sodium and hydrogen and the layers being of considerable lateral extent relative to the thickness of the basic 1.0 nm unit layer. The term "vermiculite" as used herein accordingly includes minerals consisting wholly or largely of vermiculite, or minerals of a mixed-layer type containing vermiculite layers as an important constituent, such as hydrobiotites and chlorite-vermiculites.

The term "charge per structural unit" as used in the specification and claims refers to an average charge density as specified by G. Lagaly and A. Weiss, "Determination of Layer Charge in Mica-Type Layer Silicates," Proceedings of International Clay Conference, 61–80 (1969) and G. Lagaly, "Characterization of Clays by Organic Compounds," Clay Minerals, 16, 1–21 (1981).

One term used herein which refers to the starting silicate materials is "swelled layered silicate". Such silicate material refers to the 2:1 layered silicates which have been subjected to ion-exchange reactions so that they will swell and disperse generally in aqueous solutions. This term, therefore, refers to silicate dispersions or silicate gels formed by removing water from such silicate dispersions, and dried silicate materials which can be contacted with water to form a silicate gel or dispersion.

The term "silicate dispersion" as used herein refers to the suspension of 2:1 layered silicate in a polar solution (usually water). The term "dispersion" is applied furthermore to both low solids content dispersions (about 1 to about 5% solids) which flow and have liquid properties and to the high solids content dispersions which are usually thought of as gels.

When the silicate dispersion is flocculated, the silicate agglomerates into the floc which typically drops out of the solution if the dispersion has a low solids content. The flocculation of a low solids content dispersion thus causes a more readily noticeable destabilization of the dispersion. When a high solids content dispersion or gel is flocculated by contacting the gel with the flocculant, the destablization and floc formation still take place although the change might not be visually notable without close examination. When preferred flocculants are selected, it has been found that the floc formed can be extremely distinctive in physical and electrical properties even compared to a silicate gel. For example, remarkably, the diammonium cations enable a silicate floc to be handled and washed whereas the high solids content dispersion (gel) would have washed away.

It should be emphasized that the starting 2:1 layered silicate must be a swelled layered silicate. When a natural mica is used, it is especially important to prepare the silicate so that the interstitial ion is exchangeable with the instant cations. Thus, potassium depletion must ordinarily be carried out before preparing the swelled layer silicate or silicate dispersion which is the starting material of the instant invention. This potassium depletion can be carried out using ion exchange techniques.

The starting silicate can be made according to the afore-mentioned procedures of U.S. Pat. Nos. 4,239,519; 3,325,340; or 3,434,917 or other methods for the preparation of dissociated layer materials (silicate dispersions and gels) with charge densities in the desired ranges. These aqueous silicate dispersions have also been referred to as silicate suspensions. A preferred starting material is a silicate dispersion (a swelled layer silicate) having interstitial cations selected from the group consisting of: lithium, sodium, n-butylammonium, diethylammonium, n-propylammonium.

It is noteworthy that while most silicate dispersions are prepared using water, it has been found that polar solvents can be used for the dispersion. Thus, the dispersion can also be prepared by using a selected polar solvent or mixture thereof. The polar solution can also include some non-polar hydrocarbon (less than 10% by weight). The processes and products of the instant invention can thus use polar solutions to prepare the dispersions and flocs. The cationic flocculant which is used for the ion exchange thus preparing the floc can desireably be placed in a polar solvent for the exchange.

The polar solution used in the instant process can be selected from ketones, glycols, alcohols, and water. The alcohols and ketones preferably have from 1 to 6 carbon atoms. Preferably, the solvent is a polar protic solvent mixture preferably selected from the group of water, methanol, ethanol, propanol, isopropanol, butanol and glycol. A preferred combination is methanol and water. Acceptably, the polar products solvent mixture can be a minimum of 40% by weight water; and preferably, it is a minimum of 75% by weight water. These polar product solvent mixtures are particularly useful for solvating the amino functional cationic flocculants described herein. The most preferred liquid system for both the silicate dispersion and the exchange with the cationic flocculants, however, is substantially aqueous.

The dispersed silicate is then contacted with a source of at least one species of the cations described herein to thereby effect an ion exchange reaction to occur between the instant cations and the interstitial ions. This ion exchange reaction may be carried out between the cations and the silicate material to thereby form a floc which is then utilized to form the articles of the present invention. In another embodiment of this invention, the starting silicate can be directly formed into a product, such as a fiber (for example, lithium fluorhectorite fiber) a film by using the procedures of U.S. Pat. No. 4,239,519, a molded article from the swelled-layer silicate gel (high solids content dispersion). After this, a cationic exchange reaction utilizing the instant cations can be carried out with the product, such as by immersing the product into a solution of multiamine derived cations. The ion exchange reaction may also be carried out in situ while preparing the dispersion to be flocculated.

In another preferred embodiment, the silicate dispersion is adjusted to a desired percent solids content by the addition of a specific amount of polar solvent or by the removal of solvent from the dispersion. The silicate dispersion, having the desired percent solids level, is then in a desired viscous or semi-solid state and can easily be made into a film, molded into an article, or applied to non-woven or woven fibrous materials. The resulting composition can then be contacted with the selected diammonium flocculating cation for flocculation.

Preferably, the exchange reaction is conducted for a minimum effective time period. While there is no maximum length of time for this exchange, it is desireable to complete the first step in as short a time period as possible. The ion exchange of the first step can be conducted over a period of time from 5 seconds to 10 hours and, most preferably, from 1 to 5 minutes.

The instant exchange cation should also be provided in a sufficient amount to be effective in conducting this ion exchange (flocculated) of the swelled layered silicate. While a wide range of molar ratios of exchange cation to the silicate is appropriate, the flocculating cation is used at a minimum effective concentration to cause flocculation. It has been found that solutions as low as 0.01M in diammonium compounds will flocculate the silicate. A most suitable concentration range for the solution of the instant cations can be from about 0.01 to about 3 molar, the proportion of solution to silicate being at a level convenient for further processing, at minimum one gram of solution per gram of silicate.

The term "multiamine derived cations", when used in reference to the exchange cations that may be utilized in the present invention, refers to low molecular weight, non-polymeric, di, tri, and/or tetramino functional compounds, wherein the amine moieties have been formed into cations, such as by being protonated, to thereby be positively charged. The diamines are the preferred multiamine compounds.

One preferred group of diamines have the formula:

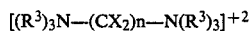

wherein (1) each $R^3$ is independently selected from hydrogen, a $C_1$-$C_8$ straight or branched chain alkyl group, or an aryl group, with the proviso that there be no more than one aryl group on each nitrogen, (2) each X is independently selected from hydrogen, an alkyl group or an aryl group and (3) n represents an integer from 2 to 15, with the option that, when n is 3 or more, the $CX_2$ groups may form ringed moieties which may be aromatic.

A similar and even more preferred group of cationic diamines are derived from compounds having the formula:

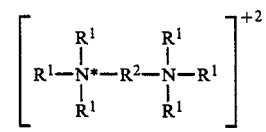

wherein (1) $R^1$, selected from the group defined above can be either hydrogen or a $C_1$-$C_8$, (saturated or unsaturated) straight or branched, chain alkyl group; preferably, $R^1$ is a $C_1$-$C_4$ straight or branched alkyl group. (2) $R^2$ is a saturated, or unsaturated linear or branched hydrocarbon moiety. Preferably, $R^2$ is an alkyl group. Suitably, $R^2$ can have from 1-8 carbon atoms. For some of these flocculants, for example, where one or more $R^1$ has from 1 to 8 carbon atoms and where $R^2$ has from 10 to 18 carbon atoms, it is desirable to use a polar solvent mixture which is polar protic.

Within this specific group of preferred cationic diamine flocculants, it has been discovered that some selection of the specific diamine flocculant can be made based upon the desired characteristics of the end floc. In other words, this specific group of diamines will yield a floc which is not only superior in wet strength and water resistance, but also demonstrates physical characteristics optimized in certain other categories which are dependent upon the carbon chain length range selected for $R^2$.

Thus, in order to obtain a final product having good flexibility, then the diamine used should correspond to the diamines having the formula indicated above which each $R^1$ is hydrogen, and $R^2$ has from 1 to 6 carbon atom, and is preferably, a saturated, branched or linear alkyl moiety. Specific diamine compounds which can be used to obtain added flexibility can be selected from the group consisting of: ethylene diammonium, 1,2-propanediammonium, 1,4-butanediammonium, 1,3-propanediammonium, 1,5-pentanediammonium and diammonium methane.

A second group of diamines capable of giving outstanding strength and water resistance especially wet and dry puncture resistance and tensile strength correspond to the formula indicated above where $R^1$ is hydrogen, and $R^2$ has from 6 to 18 carbon atoms. Preferably, $R^2$ moreover is a linear or branched alkyl group. In this category of the diamines, preferred compounds can be selected from the group consisting of: 1,6-hexanediammonium, 1,7-heptanediammonium, 1,8-octanediammonium, 1,9-nonanediammonium, 1,10-dodecanediammonium, 1,11-undecanediammonium, and 1,12-dodecanediammonium.

Another category of the diamines which is even more important for the preparation of composites, films, laminates, and other articles which must have good dielectric properties are the compounds corresponding to the above formula where $R^1$ is hydrogen and $R^2$ has 8 to 18 carbon atoms. In the most preferred of these, $R^2$ is an alkyl group. The most preferred compounds in this category can be selected from the group consisting of: 1,8-octanediammonium, 1,9-nonanediammonium, 1,10-dodecanediammonium, 1,11-undecanediammonium, and 1,12-dodecanediammonium.

The flocced silicates of the present invention can be prepared, by reacting a suitable silicate dispersion with a source of exchange cations derived from the previously specified di, tri, and tetramine compounds in order to effect an ion exchange between the multiamine derived cations and the interstitial cations in the silicate gel to form ion exchanged flocculated particles. If desired, agitation is used.

One or more different species of the instant cations can be utilized in the cationic exchange reaction. Since the various cations will give a floc, and eventually articles having certain physical characteristics, optimized, the specific cation or combination of cations will be chosen by the practitioner of this invention based on the desired end use.

The terms "multiamine derived cations" or "cationic derivative" or the like is used in the specification and claims to indicate that the center for cationic activity is centered on the nitrogen groups in the multiamines. This can be accomplished by protonating the multiamines or using the quarternary ammonium salt to obtain a positive charge. This takes place before the cationic exchange can be made with the swelled silicate gel.

While it is preferred to prepare desired articles by forming the article from a higher solids content dispersion, it is also possible to prepare the articles from the flocced material. The specific treatment steps applied to the floc will depend on the particular article being formed. For example, if the articles of the present invention are to be formed into sheet materials, the resultant exchanged floc will be agitated with sufficient shear to produce a particle size distribution which leads to suitable particle packing in the sheet forming operation. Following this process, the floc can optionally be washed to remove any excess salt solution and the consistency of the flocced slurry is adjusted to from about 0.75% to about 2% solids.

The above described slurry can be fed to a papermaking apparatus where it is dewatered by free drainage and/or vacuum drainage followed by pressing and drying on drum driers. The sheet material formed can, in turn, be used in applications such as gaskets and the like, if desired.

If desired, and depending on the intended end use of the articles, additional inert materials can also be added to the flocced mineral suspension. For example, if desired, one or more fibrous materials from the group of natural or synthetic organic fibers or inorganic fibers may be added to the floc to improve its drainage rate and to provide an end product that has improved strength and/or handleability. For example, when the desired end products are gaskets, the fibers of choice are cellulose fibers, glass fibers, and/or Kevlar fibers (Kevlar is a trademark of DuPont Corporation for an aromatic polyamide fiber). In another preferred embodiment, fibrous material is incorporated in the first step of the process to prepare a homogeneous dispersion of silicate and fiber. This mixture is then flocculated. Both organic or inorganic fibers can be used. Polybenzimidazole fibers are preferred. The fibers can be combined with either the dispersion or the floc in an amount of from about 5 to about 50% by weight of the total solids. If desired, the dispersion can be applied to a woven or non-woven fibrous substrate, followed by flocculation.

Preferably, the cationic exchange reaction is be conducted directly on a product formed from the silicate starting material. In this case, any desired additional inert materials would be added to the dispersion containing the silicate starting material prior to the formation of the article and, of course, the subsequent cationic exchange reaction.

It has been discovered that epoxy resins can be particularly desired in the instant compositions. The use of epoxy oligomers adds strength to the final product and, when used in conjunction with diamine exchanged floc, seem to promote a dual functionality in the diamines, which act not only as exchange cations for the sheet silicate material but also as a cross-linking agent for the epoxy. The resultant product has enhanced strengh, chemical resistance and dielectric properties.

If desired, an organic oligomer such as a selected epoxy resin can be homogeneously combined with 2:1 layered silicate material followed by flocculation; alternatively, the organic oligomer can also be added after flocculation.

The dispersable or swellable 2:1 layered silicate material can be combined with a specific amount of polar liquid to obtain a desired percent solids level, or solvent can be removed from the prepared dispersion to obtain the percent solids level desired. Thereafter, a combination of oligomer and silicate can be made having a specific viscosity. Flocculation can then either be conducted in a bath such as by combining the homogeneously dispersed mixture with a solution containing the flocculant, although an article or film can be formed from the non-flocculated homogeneously dispersed mixture of silicate and oligomer. The article shaped from the dispersion of the 2:1 layered silicate and organic oligomer can then be contacted with the flocculant for ion exchange to take place thereby flocculating the silicate.

An organic oligomer is understood to be a compound having from 3 to 15 repeating units. The molecular weight of such materials is generally in the range of from 350 to 10,000. Epoxies are the preferred olligomer and generally have from 5 to 15 repeating units per molecule and a molecular weight in the range of 1,500 to 3,000. When epoxies are combined with the instant silicate materials before flocculation, curing agents can also combined before flocculation. After flocculation, the epoxy which is contained within the floc can then be cured when desired by subjecting the floc to heat. Generally, at a temperature in the range of from about 120° to about 220° C.

Films can be prepared from any of the 2:1 silicate dispersions previously described, including epoxy-containing dispersions. The film can be drawn down using film-forming apparatus and flocculation can then be conducted by contacting the film with the flocculant.

It has been found that films containing epoxy can be made semitransparent by drying the films at an elevated temperature. Thus, a semitransparent film of epoxy trapped within the flocculated 2:1 layered silicate material can be prepared by drying a previously prepared and flocculated film at elevated temperatures. To avoid formation of bubbles in the film, the temperature should be less than the boiling point of water. Suitably, the temperature is from about 45° to about 95° C.

The flocculated 2:1 layered silicate and epoxy compositions acceptably have from about 1 to about 75% by weight epoxy on a dry weight basis with the silicate ranging from about 99% to about 25% by weight. A preferred epoxy concentration range is from about 10 to about 60% by weight.

In preparing such materials, a homogeneous dispersion of 5% total solids or greater of the epoxy and delaminated 2:1 layered silicate materials can be prepared. The solids having from about 1 to about 75% by weight epoxy for an acceptable floc. For dispersions having a total solids content of less than 5% the epoxy concentration in the dispersion solids preferably, is from about 2 to about 79% by weight.

Cationic flocculants derived from the diammonium compounds indicated above are extremely preferred for combination with epoxy because of the superior strength and electrical properties which can be obtained from the materials produced.

Although it is possible to use other cationic flocculants, such as aluminum, barium, etc. to flocculate the instant homogeneous dispersions of 2:1 layered silicate materials and epoxy, such flocculating cations will produce a material having less preferred qualities of water resistance, tensile strength, elasticity and electrical properties, etc. Flocculating cations derived from the diammonium cations described previously therefor are the most preferred flocculants. Other flocculating cations which are preferred are cations derived from compounds having the formula: $[R^4C(R^5)R^6]$ wherein $R^4$, $R^5$ and $R^6$ are independently selected from NH2 and CH3; provided, however, that at least two or more of $R^4$, $R^5$, and $R^6$ are NH2 but further providing that one or more of the hydrogen atoms of $R^4$, $R^5$ and $R^6$ may instead be a substituent selected from: a C1 to C5 alkyl, a C2 to C5 alkenyl, and a C2 to C5 alkynyl wherein these substituents may be linked to form one or more rings which may be saturated, unsaturated or aromatic. Preferred cationic flocculants in this group can be selected from guanidinium, aminoguanidinium, diaminoguanidinium, methylguanidinium, tetramethylguanidinium, melaminium, 2-aminopyredinium, and 2,-diaminopyridinium.

When using the diammonium cations flocculation can be carried out using an aqueous solution which is as low as 0.01 molar in the floccuating cation. Preferably, the concentration range is from about 0.1 molar to 0.5 molar. The flocculating cations act upon the silicate agglomerating the layers of silicate and arranging or holding them together into the floc. While not wishing to be bound by theory, it is felt that when flocculation of the silicate layers takes place, flocculation tends to entrap the other material fixing it more solidly within the floc. The article will then be more resilient and stronger than it would be if the material was added subsequent to flocculation. Thus, it is preferred to combine the silicate dispersion with such materials such as fibers or epoxies before flocculation.

When the epoxy is used in the instant silicate materials, a curing agent is desirably added. Curing can then conveniently be accomplished at a desired point after flocculation by subjecting the flocced products to a increase in temperature. When an article (such as a film) has been formed, whether it is from the floc itself or from a high percent solids dispersion (such as from 5 to 50% solids) curing can be accomplished by subjecting the article to a drying step (at a temperature from ambient to 90° C.) after which time the temperature is elevated for curing. The temperature range for curing is in the range of from 120° to about 220° C. It should also be noted that a curing accelerator can also be added to the dispersion with the curing agent. The addition of such materials to the epoxy-containing composition during the process and before flocculation is preferred to the addition of materials subsequently; although the curing agent can also be added at any time in the process both during and after flocculation. This can especially be appreciated if laminates and sheet materials are prepared. The curing agent can also be topically applied.

Preferred epoxy oligomers which can be used are: solid bisphenol A epoxy, urethane modified bisphenol A epoxy, polyfunctional aromatic epoxy, elastomer-modified bisphenol A epoxy. The equivalent weight of the epoxy can acceptably range from 100 to 750.

The term "water resistant" as used in the specification and claims is not meant to imply that the articles of the present invention are waterproof or are completely impervious to water. The term is used to indicate that the materials do not substantially degrade, at least in their tensile strength, elongation and puncture resistant properties, when exposed to water.

In addition to being water resistant and having excellent fire and heat resistant, it has been discovered that the articles of the present invention possess excellent electrical properties and are thereby suitable for a variety of applications, including electrical insulators, cable wrap and, in particular, printed wiring boards.

In these following Examples, unless otherwise specified, the starting material utilized was a lithium fluorhectorite made according to procedures taught in U.S. Pat. No. 4,239,519. All parts and percentages are by weight unless otherwise indicated. These samples are offered to illustrate the instant invention and should not be taken to limit it.

EXAMPLE 1

This example illustrates a method of producing both a diamine exchanged fluorhectorite flocced silicate and a formed sheet that was prepared therefrom.

A slurry of 1,6 hexanediammonium fluorhectorite (made from the corresponding diamine) was prepared by adding 200 grams of a 10% dispersion of lithium fluorhectorite to 2 liters of 1N 1,6 hexanediamine dihydrochloride solution. The slurry was then agitated with a high shear mixer to reduce the particle size of the resultant floc, was washed and then was analyzed for water content and diluted to result in a 2% solids slurry. The slurry was transferred to a 1.5"×11.5" hand sheet mold (manufactured by Williams Apparatus Co.) and dewatered. The resultant formed sheet was then wet pressed and dried on a drum drier. The sheet had good flexibility and performed well in the gasket sealing test.

EXAMPLE 2

Using the procedures of previous Example 1, a handsheet was prepared from the following slurry:

|  | Wt. Percent |
| --- | --- |
| 1,6-hexanediammonium fluorhectorite | 58.7 |
| NBR latex | 3.2 |
| Alum | 2.9 |
| Micro Talc | 5.9 |
| Redwood Fiber | 2.9 |
| Kevlar © Fiber | 2.9 |
| Mineral Wool | 23.5 |
| Total | 100.0 |

The resulting handsheet was subjected to gasket sealing tests which were electro-mechanical air leakage tests conducted according to the specifics set forth in pages 1-3 of the SAE (Society of Automotive Engineers, Inc.) technical paper No. 83022 (ISSN 0148-7191 (83/0228-0220, 1983).

The results of the tests were:

| Initial Flange Pressure (psi) | Leakage Rate (psi/min) |
| --- | --- |
| 570 | 1.389 |
| 915 | 1.587 |
| 2500 | 0.529 |

EXAMPLE 3

This example illustrates a method of producing films of the present invention wherein the cationic exchange is made in situ.

A 10% solids lithium fluorhectorite dispersion was prepared according to procedures taught in U.S. Pat. No. 4,239,519. A film was made of this material by using a 4.5 mil Bird applicator, which was 5 inches wide, to draw down a 4½ mil thick wet film of the dispersion on a glass plate. The glass plate, with the film attached, was then immersed in a 0.25M solution of 1,6 hexanediamine dihydochloride solution to cause a cation exchange between the 1,6 hexanediammonium cations and the fluorhectorite's interlayer cations. A skin was formed, seemingly instantaneously, on the film which indicated such an exchange was taking place. In 10 minutes the film was removed from the plate, washed in deionized water to remove residual salts, and dried. The film had good flexibility and strength retention when wet.

EXAMPLES 4-15

For each of these examples, the procedure of Example 3 was substantially repeated with the exchange cation (all made from the corresponding diamine) as specified to form the corresponding film.

| Example | Exchange Cation |
| --- | --- |
| 4 | N,N,N',N'—tetramethylethylenediammonium |
| 5 | o-phenylenediammonium |
| 6 | 1,2-propanediammonium |
| 7 | 1,8-octanediammonium |
| 8 | 2,5-tolylenediammonium |
| 9 | 1,7-heptanediammonium |
| 10 | 1,9-noanediammonium |
| 11 | 1,5-pentanediammonium |
| 12 | 1,2-ethylenediammonium |
| 13 | 1,3-propanediammonium |
| 14 | 1,4-butanediammonium |
| 15 | 1,12-dodecanediammonium |

COMPARATIVE EXAMPLES 1-3

These comparative examples illustrate fluorhectorite films that are made with various prior art exchange cations. Four and one half mil thick films of potassium fluorhectorite (KFH) and ammonium fluorhectorite (NH$_4$FH) were separately prepared. A film was then cast of both the KFH and a NH$_4$FH slurry. A Kymene (a trademark of Hercules, Inc. for a cationic, polyamideepichlorohydrin resin) fluorhectorite film was also prepared by the procedure of Example 2, except that (1) a 3.0% Kymene solution was used and (2) the lithium fluorhectorite film had to be immersed in the Kymene solution for 2 hours until the resultant exchanged film was sufficiently self-supporting to be removed from the glass plate. These films, along with the films made in Examples 3-15, were then subjected to tensile strength and puncture resistance tests which were conducted as follows:

Tensile Strength Measurements

Dry tensile strength measurements were determined using an Instron at 1½" jaw separation and 0.2"/min. crosshead speed. Wet strength measurements were made by bringing water-saturated sponges in contact with both sides of the film sample for 10 seconds while the sample was positioned in the Instron clamps just before the strength test was conducted.

Puncture Resistance Measurements

A sample of film was secured in a retaining device which held the film securely. A stylus which could be loaded was impinged on the film in the direction normal to the surface of the film and loaded with increasing weight until the stylus penetrated the film. In the wet test, the film in the retaining device was submerged in deionized water for 10 seconds immediately proceeding the puncture resistance test.

The data from these tests is shown in the table below.

TABLE

| Film of Example # | Exchange Cation | Tensile Strength (psi) | | Puncture Resistance (gr/mm) | |
|---|---|---|---|---|---|
| | | Dry | Wet | Dry | Wet |
| 3 | 1,6-hexanediammonium | 16000 | 17000 | 13000 | 6000 |
| 4 | N,N,N',N'—tetramethylethylenediammonium | 18000 | 16000 | 11000 | 5100 |
| 5 | o-phenylenediammonium | 13000 | 15000 | 7600 | 3000 |
| 6 | 1,2-propanediammonium | 13000 | 11000 | 14000 | 4200 |
| 7 | 1,8-octanediammonium | 12000 | 11000 | 6500 | 1700 |
| 8 | 2,5-tolylenediammonium | 9800 | 11000 | 6500 | 1800 |
| 9 | 1,7-heptanediammonium | 7300 | 8800 | 16000 | 7500 |
| 10 | 1,9-nonanediammonium | 7000 | 5000 | 3600 | 1400 |
| 11 | 1,5-pentanediammonium | 6600 | 44000 | 5700 | 5200 |
| 12 | 1,2-ethylenediammonium | 5200 | 3600 | 1200 | 600 |
| 13 | 1,3-propanediammonium | 3300 | 1400 | 3500 | 680 |
| 14 | 1,4-butanediammonium | 3000 | 1400 | 6600 | 900 |
| 15 | 1,12-dodecanediammonium | 1800 | 2900 | 3100 | 570 |
| Comparative Example # | | | | | |
| 1 | Kymene (protonated) | 7,000 | 2,700 | 900 | 260 |
| 2 | Ammonium | 3,300 | 1,400 | 3,500 | 680 |
| 3 | Potassium | 1,100 | 200 | 3,300 | 440 |

The data indicates that the films made according to the procedures of the present invention have markedly superior wet tensile strength and/or superior wet puncture resistance when compared to prior art compositions.

Fire and Smoke Resistance Data

A film prepared according to Example 3 was, after being dried, subject to fire and smoke resistant tests in accordance to the procedures specified in ASTM-E-662-79. Three separate tests were made and the results are set forth below.

Test 1-Flamability (The numerical values correspond to the maximum specified optical density as per N.B.S. Technical Note #708.)

| Flaming Mode | 0 |
|---|---|
| Smoldering Mode | 0 |

Test 2
Oxygen Index Type C ASTM D2863-77
Critical Oxygen Index—100% O₂

Test 3

| Radiant Panel ASTM-E162-79 | |
|---|---|
| Flame Spread Factor | 1.00 |
| Heat Evolution | 0.0 |
| Flame Spread Index | 0.0 |

Electrical Properties

A film of Example 3 was, when dried, tested for dielectric constant and dissipation factors using the procedures of ASTM D150 and for dielectric strength using the procedures of ASTM D149. The results, set forth below, indicate the film has utility in a variety of electrical insulating properties.

| | Dielectric Constant | Dissipation Factor |
|---|---|---|
| 100 HZ at 25° C. | 26.53 | .2888 |
| 100 HZ at 300° C. | 37.9 | .37 |
| 100 HZ return to 25° C. | 10.7 | .049 |
| 100 KHZ at 25° C. | 12.19 | .153 |
| 100 KHZ at 300° C. | 15.0 | .202 |
| 100 KHZ return to 25° C. | 9.52 | .024 |

Dielectric strength was 577v/mil.

COMPARATIVE EXAMPLES 4 AND 5

These examples illustrate using, as a starting material, silicate materials which fall outside the scope of the present invention in their charge per structural unit and their physical measurements.

For comparative Example 4, a 10% aqueous dispersion was made from a natural hectorite obtained from the source clay minerals depository of the Clay Minerals Society, Bloomington, Ind. For Comparative Example 5, a 10% aqueous dispersion utilizing sodium montmorillonite, which was obtained from the same source. In each example, a film was drawn down using the procedures set forth in Example 2. The glass plates were then immersed for 10 minutes in a 0.25M 1,6-hexanediammonium solution. In both instances, a coherent film was not produced.

EXAMPLE 16

This example illustrates a method of preparing a film of the present invention utilizing a vermiculite starting material:

A 10% solids suspension of n-butylammonium vermiculite, which was prepared according to the procedures specified in U.S. Pat. No. 3,325,340, was cast as a film on a glass plate. The film was then tested for its wet and dry tensile strength as described for comparison Examples 1-3 and Examples 3-15. The dry tensile strength was 3796 psi and the wet tensile strength is 1327 psi.

EXAMPLE 17

This example illustrates preparing fibers utilizing the method of the invention. A 15% solids suspension of lithium fluorhectorite (prepared as above) was extruded through an 11 mil opening needle into a 2N solution of 1,6-hexanediamine 2 HCL. The extruded fiber was carried by a porous belt and delivered to a second bath of 2N 1,6-hexanediamine 2 HCL. The fiber so produced was washed via submersion in deionized water and dried. The resultant fiber was strong and flexible.

EXAMPLE 18

This example illustrates the addition of an epoxy to sheet silicate composites.

Co-dispersions of the diglycidyl ether of bisphenol A (DGBA) and lithium fluorhectorite (LiFH) were prepared by adding the epoxy to a 10% (solids) aqueous lithium fluorhectorite dispersion. The co-dispersion was then mixed via a high shear process. The co-dispersions were formed in the following ratios of LiFH to DGBA:

1. 100 gr. 10% solids LiFH dispersion (10 gr. LiFH solids) 0.1 gr. epoxy (approx. 1% on solids basis).

2. 100 gr. 10% solids LiFH dispersion 1.1 gr. epoxy (approx. 10%).

3. 100 gr. 10% solids 2.5 gr. epoxy (approx. 25%).

The films were prepared by producing 4.5 mil wet films on glass plates with a Bird applicator and immersing the film in a 0.25M hexanediamine 2 HCL solution at a pH of 7.0. The resultant films had good wet strength characteristics of hexamethylene diammonium exchanged fluorhectorite. The resultant film was washed with deionized water to remove excess hexamethylene diamine 2 HCL and dried at 60° C. The dry films which were flexible were heated to 150° C. for 3 hours. The resultant films exhibited increased rigidity as would be expected with epoxy curing. Therefore, it appears that the 1,6-hexanediammonium cation is effective in performing the layered silicate exchange function and epoxy curing.

For an alternative method of making the articles, epoxy/fluorhectorite co-dispersion as described above were converted to floc form through the addition of the co-dispersion to a 0.25M 1,6-hexanediamine 2 HCL solution with agitation. After washing the excess 1,6-hexanediamine 2 HCL from the floc, the floc solids content was adjusted to 2% and subjected to high shear mixing to reduce the particle size. The resultant material was transferred to a nonporous mold and allowed to dry to coherent flexible films of approximately 10 mils thickness.

The films were hot pressed at 150° C. for 3 hours and the films become more rigid.

From 1 to 80 weight parts of epoxy resins can be utilized in producing articles according to the present invention, based on the solids weight of the sheet silicate starting material.

EXAMPLE 19

This example illustrates the differences in elongation and electrical properties one can achieve by varying the diammonium ion used in the instant exchange process. For these experiments, films were prepared utilizing vermiculite dispersions. A film was made by using a 10 mil Bird applicator which was 5 inches wide to draw down a film on a glass plate. The glass plate with the film attached was then immersed in a 0.25M solution of the 1,4-butanediamine dihydrochloride solution at 55° C. to cause a cation exchange between the 1,4-butanediammonium cations and the vermiculite interstitial cations. A skin was formed, seemingly instantaneously, in the film which indicated such an exchange was taking place. The film was allowed to set in the solution an additional 4 hours to ensure the exchange. The film was then removed from the plate, washed in deionized water to remove residual salts and dried. This film had extremely high elongation.

EXAMPLES 20-27

For each of these examples, the procedure of Example 19 was repeated with the exchange cation (all made from the corresponding diamine) as specified to form the corresponding film. The tensile strength and elongation properties are given in Table I while the electrical properties are shown in Table II.

TABLE I

| Film of Example # | Exchange Cation | Tensile (psi) Dry | Tensile (psi) Wet | % Elongation Dry | % Elongation Wet |
|---|---|---|---|---|---|
| 20 | 1,2-ethanediammonium | 5,100 | 3,000 | 2 | 1.2 |
| 21 | 1,3-propanediammonium | 7,333 | 7,065 | 1.8 | 1.6 |
| 19 | 1,4-butanediammonium | 4,500 | 4,200 | 3.5 | 2.8 |
| 22 | 1,5-pentanediammonium | 10,414 | 8,630 | 3.0 | 2.2 |
| 23 | 1,6-hexanediammonium | 10,600 | 8,806 | 1.4 | .8 |
| 24 | 1,7-heptanediammonium | 13,605 | 8,838 | 0.9 | 0.7 |
| 25 | 1,8-octanediammonium | 11,200 | 10,600 | 0.6 | 0.6 |
| 26 | 1,9-nonanediammonium | 10,394 | 10,251 | 0.7 | 0.6 |
| 27 | 1,10-decanediammonium | 6,553 | 6,040 | 1.0 | 0.8 |

In general, the diammonium exchanged vermiculite shown in table I exhibits good tensile strength both wet and dry. The high elongation properties of the films of Examples 19-22 are truly unique and unexpectedly higher than Examples 23-27. The high elongation properties of these films in Examples 19-23 may allow these materials to be used in applications where the layered silicate material must be used for wrapping.

TABLE II

| Film of Example # | Exchange Cation | Dielectric Constant (50% RH) 100 Hz | Dielectric Constant (50% RH) 1 MegaHz | Dissipation Factor (50% RH) 100 Hz | Dissipation Factor (50% RH) 1 MegaHz |
|---|---|---|---|---|---|
| 20 | 1,2-ethanediammonium | 500 | 10 | 1.2 | 0.25 |
| 21 | 1,3-propanediammonium | 250 | 8.0 | 0.80 | 0.20 |
| 19 | 1,4-butanediammonium | 140 | 8.3 | 0.63 | .24 |
| 22 | 1,5-pentanediammonium | 100 | 8.0 | 0.90 | 0.20 |
| 23 | 1,6-hexanediammonium | 100 | 8.0 | 1.1 | .15 |
| 24 | 1,7-heptanediammonium | 63 | 8.0 | 0.90 | 0.18 |
| 25 | 1,8-octanediammonium | 20 | 8.0 | 0.54 | 0.09 |
| 26 | 1,9-nonanediammonium | 18 | 9.0 | 0.33 | 0.10 |
| 27 | 1,10-decanediammonium | 19 | 8.5 | 0.36 | 0.12 |

As shown in Table II, the exchange ion used in making the films has a unexpected effect in the dielectric properties of layered silicate based films. In general, as one increases, the carbon length between ammonium groups one sees an improvement in the dielectric properties of the films. In general, Examples, 25, 26 and 27 are unique in that their is not a real variatiin in dielectric oconstant and dissipation factor as one goes from 100 Hz to 1 Mega Hz. This is a highly desirable trait for materials used for electrical application. The dielectric constant and dissipation factor were obtained following the general guidelines in ASTM D150 under three terminal guarded electrode procedures with the following exceptions: (1) the samples were of necessity thinner than recommended; (2) the three terminal arrangement was converted to five terminal to accommodate the requirements of the Hewlett Packard 4192A Low Frequency Network Analyzer used to measure capacitance and conductance between 10 Hz and 10 MHz. The electrodes used were either vacuum deposited gold or painted silver (Electrodag 504, manufactured by Acheson, Port Huron, Mich.). The low electrode was 1.25 inches in diameter and the sample thickness was approximately 1 mil. Standardization was done by determining the dielectric permitivity of Teflon ® sheets of similar thickness with the same types of electrodes. The Teflon ® values obtained agreed with literature values to 2%.

EXAMPLE 28

The Preparation of an Epoxy/Silicate Composite Containing a Curing Agent

For this example, the epoxy used was: (CMD W60-5520) a non-ionic dispersion of a urethane modified bisphenol A epoxy resin having an epoxide equivalent weight of 540 and solids content of 60%.

An aqueous solution of an epoxy curing agent was prepared as follows:

117.6 g of deionized water was heated to 50° C. on a magnetic stirring hotplate. 31.5 g of Dicyardiamide (Dicy) was slowly added. The temperature was raised to 65°–70° C. at which point the Dicy was completely dissolved. Then 0.9 g of 2-Methylimidazole (2-MI) was added to this hot solution (2-MI used as cure accelerator).

A catalysed, epoxy dispersion was then prepared by adding 10 g of the above hot curing agent solution to 150 g of aqueous, urethane modified epoxy (CMD W60-5520). An additional 3.6 g of deionized (DI) water was added to the dispersion.

The co-dispersion of epoxy and vermiculite, also including the curing agent, was prepared as follows: 17.04 g of the above epoxy dispersion was added to 300 g of a 12% solids vermiculte dispersion in deionized water. This mixture was homogenized at low speed for 15 min. after which it was allowed to stand overnight for removal of entrapped air.

Separate films were drawn down on clean, glass plates using a Bird blade applicator with opening adjusted to give a wet film thickness of 10 mils. The plates were inverted (film side down) into a 0.5N (0.25M) solution of 1,6-hexanediamine dihydrocholoride at a pH of 7 and maintained at a temperature of 55° C. The films were then washed in deionized water until essentially chloride free (silver nitrate test). Drying for one film was carried out at ambient temperature (20° C.) and another at elevated temperature (55° C.) which quite unexpectedly yielded entirely different results:

(A) The ambient drying produced an opaque film; 2–2½ mils thick.

(B) The 55° C., drying produced a semi-transparent film 1–1½ mils thick. SEM cross-sections also reveal surprising differences with the ambient dried samples showing a light scattering platelet structure and the oven dried samples a compressed, laminar structure. There is also some indication that the electrical properties are improved with the elevated temperature drying process.

EXAMPLE 29

Samples of epoxy/silicate films were prepared using two different epoxies, generally following the mixing procedure described in Example 4. The following epoxy and vermiculite co-dispersions were prepared:

| Materials for Samples A-D | Amount of Ingredients for Samples A-D | | | |
|---|---|---|---|---|
| | A | B | C | D |
| Vermiculite (See note 1) (12% solids) | 3000 g | 3550 g | 1500 g | 1500 g |
| CMD W60-5520 Epoxy | 150 g | 175 g | — | — |
| CMD W55-5003 (See note 3) Epoxy | — | — | 81.8 g | 81.5 g |
| Acrylic Emulsion (See note 2) | 83.5 g | — | — | — |
| Dicyandiamide | — | — | — | 3.15 g |
| 2-methylimidazole | — | — | — | 0.09 g |

Note (1) Vermiculite dispersion having an average particle size of 25 microns.
Note (2) Acrylic emulsion (UCAR 123) obtained from Union Carbide Corp. and having a particle size of 0.5 microns and a solids content of 60% added as a modifier to toughen the film.
Note (3) CMD W55-5003 - A non-ionic dispersion of a polyfunctional aromatic epoxy resin with an average functionality of three and a solids content of 57%.

Films of the above formulations were preapred using a 0.4 Normal solution of 1,6-hexanediamine dihydrochloride. The films were washed with deionized water and then dried at 55° C.

Multiple layers of the films have been hot pressed into laminates ranging in thickness from 4 to as much as 200 mils. Prior to lamination, it is generally preferably to pre-bake the films to remove traces of water and other volatiles. A 3 hour cycle at 150° C. in a convection oven has produced good results.

Various tests have been conducted with the results summarized below:

| Test (For Units) | Method | Samples & Results | | | |
|---|---|---|---|---|---|
| | | A | B | C | D |
| X-Axis CTE (See note 4) | ASTM D646 | 10.6 | 11.7 | — | — |
| Y-Axis CTE (See note 4) | ASTM D646 | 11.4 | 11.0 | — | — |
| Z-Axis (See note 4) | ASTM D646 | 171 | 60–80 | — | — |
| Tg (5) | IPC 2.4 .24 | — | — | 59.6 | 123.2 |
| Flexural Strength (See note 6) | ASTM D790 | 24,500 | 31,000 | — | — |
| Flexural Strength (AMD) | | 20,500 | 23,000 | — | — |
| Flexural Modulus (See note 7) | | 4,400 | 6,900 | — | — |
| Flexura Modulus (AMD) | | 3,050 | 4,500 | — | — |

Note (4) Coefficient of Thermal Expansion; Units are in PPM/°C.
Note (5) Glass Transition Temperature (TMA Method); Units are °C.
Note (6) Conditions are: 1.5 inch span and crosshead speed of 0.02 inch/minutes; Units are PSI.
Note (7) Conditions same as (4); Units are million pounds per square inch (MSI).

As can be seen from the data for samples C and D, the presence of a curing agent greatly affects the glass transition temperature. While the curing agent can be incorporated into the silicate/resin dispersion as shown by sample D and in Example 4, in many cases it is preferrable to apply the curing agent by a topical application. This is particularly the case where the films are given a high temperature pre-bake prior to lamination. Curing will take place as the films are subjected to the heat.

High values of samples A and B for flexural modulus is noteworthy. This indicates that the structures are very rigid and coplanar (flat), ideal characteristics for uses such as printed wiring boards.

EXAMPLE 30

Solutions were prepared using the composition of sample A (see example 29) with the different curing agents solutions described in Samples E–H. Sample I had no curing agent: The following solutions were prepared:

| Sample # | Curing Agent Composition |
| --- | --- |
| E | 6.2% DDS - See note 8 - .3% BF$_3$MEA cure accelerator - Note 9<br>93.5% solvent - Note 10 |
| F | 12% DDS (Note 8); 0.6% BF$_3$MEA - Note 9; 87.4% solvent |
| G | 1.6% dicyandiamide: 0.8% 2-methylimidazole; 97.6% solvent (Note 10) |
| H | 1.2% BF$_3$MEA (Note 8); 98.8% solvent (Note 10) |
| I | NONE |

Note (8) Diamino Dihenyl Sulfone (DDS) (Hardener HT 976 from Ciba-Geigy).
Note (9) Boron Trifluoride Monoethylamine (MEA) complex from Harshaw Chemical.
Note (10) acetone:methylisobutyl ketone (50:50) was the solvent for the curing agent.

Film of Composition A in the previous example was used in this experiment. Samples of the film (4-½×4-½) were immersed in the above solutions to give a wet pickup of 50%. After air drying to remove the solvent, the treated films were conditioned for 8 hours in vacuum oven at 100° C. Thick laminates (58 mils) were prepared by hot pressing 32 plies of film together. The glass transition temperature was determined by two methods (TMA & DSC) and the results are given in the following table:

| Curing Agent | Tg (°C.) by TMA | Tg (°C.) by DSC |
| --- | --- | --- |
| E | 96 | 104 |
| F | 88 | 101 |
| G | 82 | 107.5 |
| H | 75 | 78.2 |
| I (None) | 68 | 74.5 |

As can clearly be seen all of the curing agents have increased the Tg thus demonstrating the efficacy of a topical application method.

EXAMPLE 31

Example of silicate/epoxy film composite with topical application of a resin adhesive.

A dispersion of Lithium Taeniolite (LiTn) (See note 1) and the water dispersible epoxy of Example 28 was prepared in the following manner:

LiTn powder was sieved through a 75 micron screen and the average particle size was found to be 22 microns. Then 36 g of this powder was dispersed in 264 g of water using a homogenizer. To this dispersion 13.8 g of the epoxy dispersion was added while mixing. After moderate mixing, the dispersion was allowed to stand for a period of time to allow entrapped air to escape.

1. A synthetic fluoromica Topy (Japan)

This shows that in order to lower the thermal expansion, it is advantageous to include the resin in the composition, thus avoiding topical application. Thermal expansion values for these compositions having the internal resin binder is desireably lower than the composition using the external resin binder.

Then, using a Bird blade as previously described, films of this dispersion were prepared and a flocculating cation exchange bath consisting of 0.2N melamine hydrochloride (Ph of 3.5) at a temperature of 55°-60° C. was used. The final dried film contained 15% by weight of the epoxy resin and had an X-Y axis CTE value of 6 PPM/° C.

A sample of the above film was dip coated with the above epoxy resin dispersion to a wet pickup of 21% resulting in a total epoxy resin content of 28%—15% internally applied and 13% externally applied. After air drying and prebaking, 8 plies of the coated film were hot pressed to produce a laminate 21 mils thick and having an X-Y coefficient of thermal expansion (CTE) of 14 PPM/°C. A similar laminate prepared with 25% internal resin binder and having no external resin coating had a CTE value of 7.5 PPM/°C. (a desireably low value).

EXAMPLE 32

This example offered to contrast ornithine with the instant diammonium compounds (having no acid moiety).

A glass mat was saturated with a 10% solids lithium fluorhectorite dispersion using a 4.5 mil Bird blade. The coated glass mat was then immersed in a 0.25M solution of ornithine hydrogen chloride solution at 60° C. for one hour. The coated mat was then removed from this solution and placed in deionized water and was washed in order to remove the excess salt. During this washing process, the ornithine exchanged fluorhectorite was washed off the glass mat, leaving the mat uncoated and nearly bare.

It should be noted that the ornithine flocculated the silicate dispersion, but contact with water dispersed and washed away the ornithine-exchanged silicate. The instant diammonium cations, however, can produce a washable silicate floc even at a concentration as low as a 0.01 Molar solution.

What is claimed is:

1. A method of preparing a flocced mineral material that can be utilized to form a non-asbestos high temperature article that exhibits water resistance, this method comprising (1) contacting a layered silicate having an average charge per structural unit in the range of from about −0.4 to about −1 which was exchangeable interstitial ions that promotes layer swelling, and is selected from mica and vermiculite, with a polar liquid to cause gel formation and form a swelled layered silicate dispersion, and then (2) contacting the swelled layered silicate dispersion with at least one species of an exchange ion consisting essentially of a cationic diamine compound to flocculate the silicate by an ion exchange reaction between at least some of the exchangeable interstitial ions, and at least some of the exchange ions to form a flocculated silicate product.

2. The method of claim 1 wherein the swelled layered silicate is a synthetic silicate and the interstitial ions are Li+ and/or Na+.

3. The method of claim 1 wherein the silicate is a mica.

4. The method of claim 3 wherein the mica is selected from the group consisting of: fluorhectorite, hydroxyl hectorite, boron fluorphlogopite, hydroxyl boron phologopite, and solid solutions thereof as well as between members of the groups and other structurally compatible species selected from the group of talc, fluortalc, polylithionite, fluorpolylitionite, phlogopite and fluorphlogopite.

5. The method of claim 3 wherein the swelled layered silicate dispersion was made into a film before Step 2 was conducted.

6. The method of claim 3 wherein the swelled layered silicate dispersion that was flocculated also contained fiber.

7. The method of claim 1 wherein the silicate is vermiculte.

8. The method of claim 7 wherein the swelled layered silicate dispersion was made into a film before Step 2 was conducted.

9. The method of claim 7 wherein the swelled layered silicate dispersion that was flocculated in Step 2 also contained fibers.

10. The method of claim 1 wherein the swelled layered silicate dispersion was made into a film before Step (2) was conducted.

11. The method of claim 1 wherein the swelled layered silicate dispersion also contains fibers.

12. The method of claim 1 wherein the swelled layered silicate dispersion is in excess of 5% by weight solids.

13. A method as described in claim 12 wherein the layered silicate (a) includes a silicate with a charge density in the range of from $-0.6$ to $-0.9$, or (b) includes a silicate with a charge density approximately equal to $-1$.

14. The method of claim 1 wherein the swelled layered silicate dispersion is molded into an article before contacting it with the cationic diamine compound.

15. The method of claim 1 wherein the swelled layered silicate dispersion is (a) combined with a non-woven fibrous material or (b) combined with a woven fibrous material before contacting it with the cationic diamine compound.

16. A method of claim 1 wherein the flocculated silicate product is then combined with fiber.

17. A method of preparing a flocced mineral material comprising: contacting a layered silicate selected from the group consisting of mica and vermiculite, which contains exchangeable interstitial ions which promote layer swelling, with a polar liquid to form a swelled layered silicate dispersion and contacting the swelled layered silicate with at least one species of an exchange cation which is a diammonium compound having a formula corresponding to:

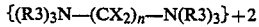

wherein (1) each R3 is independently selected from hydrogen, a C1-C8 straight or branched chain alkyl group, or an aryl group, with the proviso that there be no more than one aryl group on each nitrogen, (2) each X is independently selected from hydrogen, an alkyl group or an aryl group and (3) n represents an integer from 2 to 15, with the option that, when n is 3 or more, the $CX_2$ groups may form ringed moieties which may be aromatic, to flocculate the silicate by an ion exchange reaction between at least some of the exchangeable interstitial ions, and at least some exchange cations and form a flocculated silicate product.

18. A method as described in claim 17 wherein (a) the exchange cation is selected from the group consisting of: 1,8-octanediammonium; 1,7-heptanediammonium; 1,9-nonanediammonium; 1,10-dodecanediamine; 1,11-undecanediammonium; 1,12-dodecanediammonum; and 1,6-hexanediammoniun or (b) at least one of the species of exchange cation is N,N,N',N'-tetramethylethylenediammonium; o-phenylenediammonium; 1,2-propanediammonium; 1,8-octanediammonium; 2,5-tolyenediammonium; 1,7-heptanediammonium; 1,9-nonanediammonium; 1,5-pentanediammonium; 1,2-ethylenediammonum; 1,3-propanediammonium; 1,4-butanediammonium; 1,12-dodecanediammonium; or 1,6-hexanediammonium.

19. A method as described in claim 17 wherein the layered silicate is vermiculite.

20. A method as described in claim 17 wherein the polar liquid is substantially aqueous.

21. A method as described in claim 17 wherein the layered silicate is mica.

22. A method of preparing a flocced mineral material comprising: contacting a layered silicate which has exchangeable interstitial ions that promote swelling and has an average charge per structural unit that ranges from about $-0.4$ to about $-1$, with a polar liquid to form a swelled layered silicate dispersion, combining this silicate dispersion with a fibrous material that contains fibers made of polybenzimidazole and contacting the dispersion with at least one species of an exchange cation consisting essentially of a cationic diamine compound to flocculate the silicate by an ion exchange reaction between at least some of the exchangeable interstitial ions, and at least some of the exchange cations to form a flocculated silicate product.

23. A method as described in claim 22 wherein the cationic diamine compound is either (a) represented by the formula:

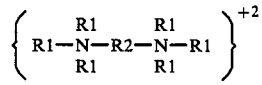

wherein (1) each R1, can independently be either hydrogen or a C1–C8 saturated or unsaturated, straight or branched, chain alkyl group, and (2) R2 is a saturated, or unsaturated, linear or branched hydrocarbon moiety, or (b) has a formula corresponding to:

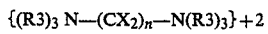

wherein (1) each R3 is independently selected from hydrogen, a C1–C8 straight or branched chain alkyl group, or an aryl group, with the proviso that there be no more than one aryl group on each nitrogen; (2) each X is independently selected from hydrogen, an alkyl group or an aryl group and (3) n represents an integer from 2 to 15, with the option that, when n is 3 or more, the $CX_2$ groups may form ringed moieties which may be aromatic.

24. A method as described in claim 22 wherein the fibrous material can be (1) loose fibers or (2) a woven fibrous substrate or (3) a non-woven fibrous substrate.

25. A method as described in claim 22 wherein the layered silicate used contains a mica.

26. A method as described in claim 22 wherein the fibrous material also contains some mineral wool, cellulose fibers or glass fibers.

27. A method as described in claim 22 wherein the polar liquid is substantially aqueous.

28. A method as described in claim 22 wherein the layered silicate used contains a vermiculite.

29. A method of preparing a flocced mineral material comprising:

contacting a layered silicate which is selected from the group consisting of mica and vermiculite, and which contains exchangeable interstitial ions that promote layer swelling, with a polar liquid for a sufficient time to form a swelled layer silicate dispersion and contacting the swelled layer silicate dispersion with at least one species of an exchange cation which is a diammonium compound having the formula corresponding to:

$$\left\{ \begin{array}{ccc} R1 & & R1 \\ R1-N-R2-N-R1 \\ R1 & & R1 \end{array} \right\}^{+2}$$

wherein (1) each R1, can independently be either hydrogen or a C1–C8 saturated or unsaturated, straight or branched, chain alkyl group, and (2) R2 is a saturated, or unsaturated linear or branched hydrocarbon moiety with from one to 18 carbon atoms, to flocculate the silicate by an ion exchange reaction between at least some of the exchangeable interstitial ions and at least some exchange cations and form a flocculated silicate product.

30. A method as described in claim 29 wherein the polar liquid is substantially aqueous.

31. The method of claim 29 wherein the layered silicate selected is either mica, or vermiculite.

* * * * *

UNITED STATES PATENT AND TRADEMARK OFFICE
CERTIFICATE OF CORRECTION

PATENT NO. : 4,877,484

DATED : October 31, 1989

INVENTOR(S) : Walter J. Bohrn et al

It is certified that error appears in the above-identified patent and that said Letters Patent is hereby corrected as shown below:

In the Specification, in column 7, line 5, "1-8" should read --1-18--, and in column 11, line 29, "1.5" should read --11.5--.

Signed and Sealed this

Second Day of October, 1990

Attest:

HARRY F. MANBECK, JR.

Attesting Officer

Commissioner of Patents and Trademarks